INVENTOR.
Frank B. Iles
BY Morris A. Rabkin
ATTORNEY.

Nov. 27, 1956 F. B. ILES 2,771,852

SOLDERING MACHINE

Filed Nov. 1, 1955 4 Sheets-Sheet 2

INVENTOR.
Frank B. Iles
BY Morris A. Rabkin
ATTORNEY.

INVENTOR.
Frank B. Iles
BY Morris [signature]
ATTORNEY.

Nov. 27, 1956 F. B. ILES 2,771,852

SOLDERING MACHINE

Filed Nov. 1, 1955 4 Sheets-Sheet 4

INVENTOR.
Frank B. Iles
BY Morris Rabkin
ATTORNEY.

2,771,852

SOLDERING MACHINE

Frank B. Iles, Lumberton, N. J., assignor to Radio Corporation of America, a corporation of Delaware Application November 1, 1955, Serial No. 544,229
6 Claims. (Cl. 113—59)

This invention relates to a soldering machine, and more particularly to an improved machine for automatically applying solder to a sheet of insulating material having a plurality of electrical conductors disposed on a surface of the sheet for the purpose of soldering the conductors.

This machine is especially adaptable to the soldering of printed circuits. One common type of printed circuit comprises a sheet of electrically insulating material, such as a phenolic board, carrying on one surface thereof a plurality of electrical conductors in the form of thin flat strips integrally united to the insulating material. The conductors are referred to as printed wiring. The printed circuit assembly is completed by mounting on the other surface of the sheet, which will be referred to as a wiring board, a number of components and connecting them by means of leads extending through apertures in the wiring board to the printed wiring on the other side. There is a considerable problem in making these connections rapidly, efficiently, and effectively.

In the highly competitive field concerned with the manufacture of printed circuits for use in all types of electrical and electronic equipment, it is desirable to have an automatic machine which is capable of soldering all of the connections of a printed circuit substantially simultaneously. One method of soldering all such connections simultaneously is a dip-soldering technique. In this technique, the entire side of the printed circuit containing the printed wiring, with the leads from the circuit components projecting from various points on the surface, is dipped face down in a bath of molten solder and removed after a period of immersion. This results in coating the printed wiring with solder and soldering all of the connections at the same time.

The dip-soldering technique has certain undesirable limitations and disadvantages. One disadvantage is that a bath of molten solder required by this technique has its upper surface necessarily exposed to air so that oxide readily forms on this surface at its elevated temperature of several hundred degrees, and this oxide formation occurs anew after each of the dipping operations. Dross and scum also form during the dipping operations and float with the oxide on the molten solder surface. These impurities on the solder surface tend to impair the desirable attainment of clean, well soldered electrical connections.

An additional disadvantage of the dip-soldering technique is that the solder tends to bridge over small gaps in the printed wiring and thus complete electrical connections between adjacent wiring where none was intended or desired.

An object of the present invention is to provide a novel soldering machine which overcomes the above mentioned disadvantages of prior machines and techniques.

Another object of this invention is to provide an automatic soldering machine which accomplishes clean, well soldered joints rapidly, effectively, and efficiently and which uses a minimum amount of solder.

A further object of this invention is to provide an automatic soldering machine which permits soldering at temperatures lower than that required for dip soldering and which provides control of the amount of solder deposited on a sheet.

A still further object of this invention is to provide an improved automatic soldering machine which is readily adaptable to automatic assembly techniques.

A machine in accordance with the present invention for accomplishing these and other objects includes a rotary brush rotatably mounted in a tank of molten solder. The brush is mounted to be almost entirely submerged in the molten solder. Means are provided for pumping solder from a solder reservoir into the hollow, perforated spindle of the rotary brush whereby solder is forced outwardly through the brush. Means are provided adjacent the top of the tank for directing surface flow of the solder across the brush to maintain a continuous film of solder over the brush. This film protects the brush from exposure to the air. Means are further provided for directing the flow of solder from the container to the reservoir thereby continuously carrying the surface contamination of the solder away from the rotating brush.

The novel features of the invention, as well as additional objects and advantages thereof, will be understood more fully from the following description when read in connection with the accompanying drawings, in which.

Figure 1:
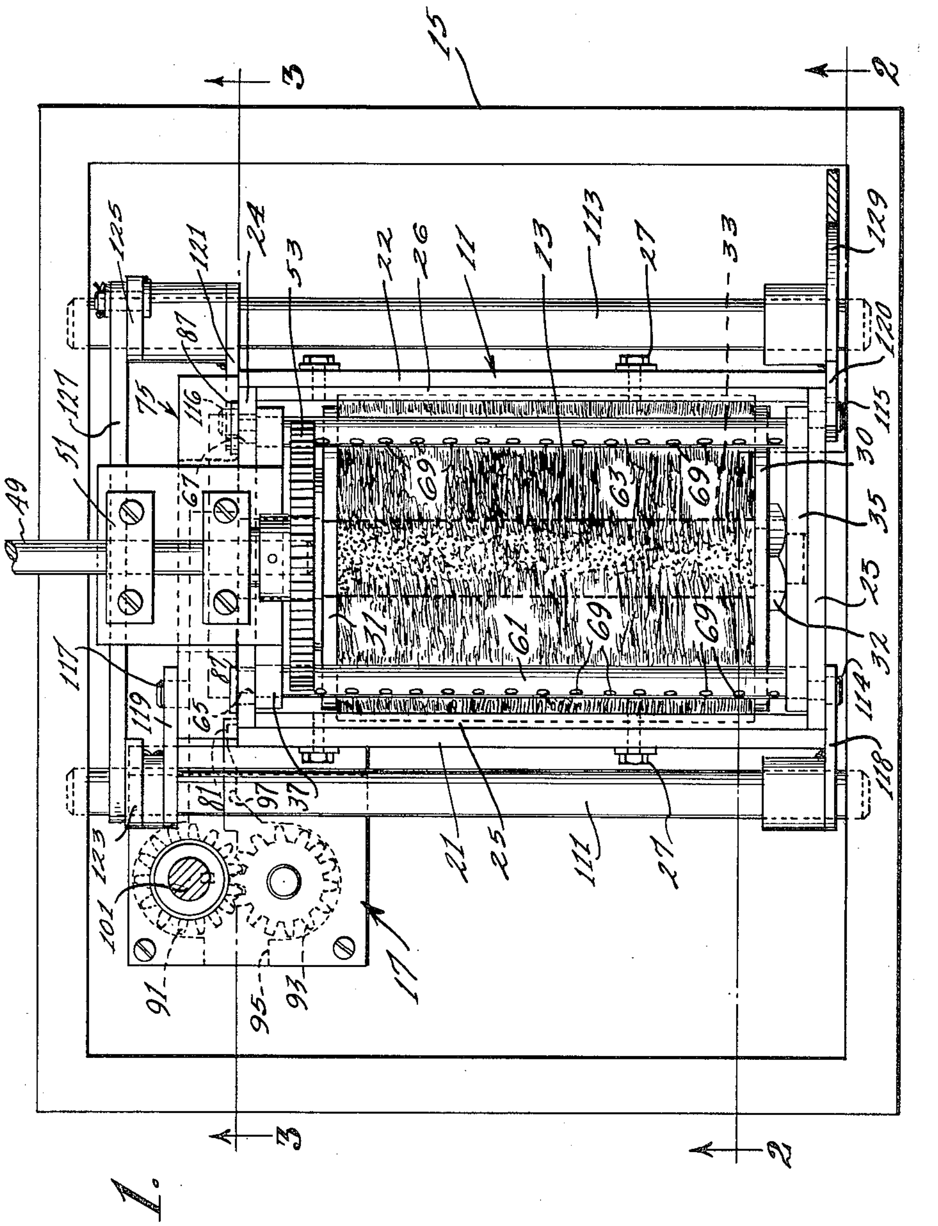
Figure 1 is a view in plan of a machine in accordance with the present invention.

Referring in more detail to the accompanying drawings, one embodiment of a machine in accordance with the present invention will be described. In general the machine includes an inner solder pot or tank 11 having a rotary brush 13 mounted within it. The inner tank 11 is disposed in an outer solder pot or reservoir 15. A gear pump 17 is mounted exteriorly of the tank 11 and pumps molten solder from the reservoir 15 through particular channels into the tank 11. Means are provided for driving the gear pump 17 and the rotary brush 13.

The tank 11 includes side walls 21 and 22 and end walls 23 and 24. The side walls 21 and 22 are provided at their upper edges respectively with gates 25 and 26. These gates are in the from of wall extensions which are secured to the side walls by means of bolts 27 and which may be raised or lowered to adjust the effective height of the side walls 21 and 22. By means of these gates the solder level in the tank 11 is controlled.

The rotary brush 13 is made up of a number of rotary brush segments 29 mounted on a hollow spindle 33. These segments 29 are secured to the spindle 33 by means of end plates 30 and 31. The end plate 31 bears against a shoulder on the spindle 33, and the end plate 30 is secured on the spindle by means of a nut 32. The spindle 33 is mounted for rotation in bearing blocks 35 and 37 which are disposed, respectively, adjacent to the end walls 23 and 24 of the tank 11. The spindle 33 is closed at its end adjacent to the end wall 23 and is open at its end adjacent to the end wall 24. An aperture 39 is provided in the end wall 24 and is aligned with the spindle 33 to permit the flow of solder into the spindle from a manifold outside of the tank 11. The spindle 33 is provided with a plurality of apertures 41 which are spaced longitudinally and radially in the walls of the spindle. These apertures permit the passage of molten solder from within the spindle outwardly to the exterior surface of the rotary brush 13. This flow of solder through the brush from its center tends to keep the brush clean and to remove scum which tends to adhere to the outer surface of the brush.

The brush 13 is driven by means of a gear 47 which is fixed to the spindle 33 adjacent to the end wall 24. A shaft 49 is mounted for rotation in bearings 51 which are mounted on the tank 11. The shaft 49 is adapted to be connected to an external source of power and carries a gear 53 which meshes with the gear 47.

A pair of tubes 61 and 63 are supported between the end walls 23 and 24 in the bearing blocks 35 and 37. These tubes 61 and 63 are mounted near the top of the tank 11 and close to the surface of the brush 13 and are provided to direct flow of molten solder over the brush as will be seen. The end wall 24 is provided with apertures 65 and 67 which are aligned respectively with the tubes 61 and 63. These apertures are provided for permitting the passage of molten solder into the tubes from outside of the tank 11. The tubes 61 and 63 are each provided with a single row of apertures 69 which extends longitudinally of the tubes. The tubes 61 and 63 are rotatable within the mounting blocks 35 and 37 and the apertures 69 act as jets which may be directed to control the flow of solder on the surface of the tank 11.

A manifold 75 is mounted on the outer surface of the end wall 24. The manifold is formed from a block which is in the shape of a T having a member 77 extending from the base of the T parallel to the cross arm of the T. One face of the manifold is milled out, or otherwise provided with grooves having the same configuration as the manifold itself. None of these grooves extend to the periphery of the milled face. When the manifold is secured to the end plate 24 the grooved portion forms a chamber or passageway 79 for molten solder. The end of the member 77 is provided with an opening 81 to provide an inlet to the chamber 79. When the manifold 75 is fixed to the end wall 24, the passageway formed by the cross arm of the T extends over the apertures 65 and 67 in the end wall to provide for the feeding of molten solder to the tubes 61 and 63. The passageway in the trunk of the T coincides with the aperture 39 in the wall 24 to provide for the feeding of solder to the spindle 33.

The face of the manifold which is secured against the end wall 24 is further provided with a pair of shallow grooves 85 which extend from the top of the manifold to the cross arm passageway. These grooves are positioned so that when the manifold is secured to the end wall the grooves are disposed to intersect the apertures 65 and 67. The grooves then provide rectangular shaped channels into which are inserted gates 87. These gates are provided so that the apertures 65 and 67 may be either partially or completely closed off from the passageway 79. By means of these gates 87, the flow of solder on the surface of the tank 11 is additionally controlled.

The gear pump 17 is composed of a box like structure which is secured to the side wall 21 of the tank 11. The pump includes a chamber having meshing gears 91 and 93 and operates in a manner well known. The pump includes an inlet opening 95 and an outlet opening 97. The outlet opening 97 coincides with the opening 81 in the manifold 75 when the gear pump is mounted on the tank 11. A cylindrical housing 99 is mounted on top of the gear pump housing and extends beyond the top of the tank 11. This housing 99 encloses a shaft 101 which is secured to the gear 91 at its lower end and has a gear 103 fixed to it at its upper end. The gear 103 meshes with a gear 105 which is driven by an external power source.

The entire assembly, above described, including the tank 11, the manifold 75 and the gear pump 17, is supported within the reservoir 15 in a manner such that it may be raised or lowered with respect to the reservoir. The supporting means includes a pair of shafts 111 and 113 which are rotatably supported at their ends in the walls of the reservoir 15. The end walls of the tank 11 are provided with outwardly extending pins 114, 115, 116 and 117, the last named of these pins extending from the manifold 75. A pair of arms 118 and 119 are rigidly fixed to the shaft 111 and engage, respectively, the pins 114 and 117. A pair of arms 120 and 121 are rigidly fixed to the shaft 113 and are each provided with a slot for engagement, respectively, with the pins 115 and 116. A downwardly extending arm 123 is rigidly fixed to the shaft 111 and an upwardly extending arm 125 is rigidly fixed to the shaft 113. These arms 123 and 125 are connected by a link 127. An operating arm 129 is rigidly fixed to the shaft 113 and extends upwardly beyond the upper edge of the reservoir 15.

Figure 2:
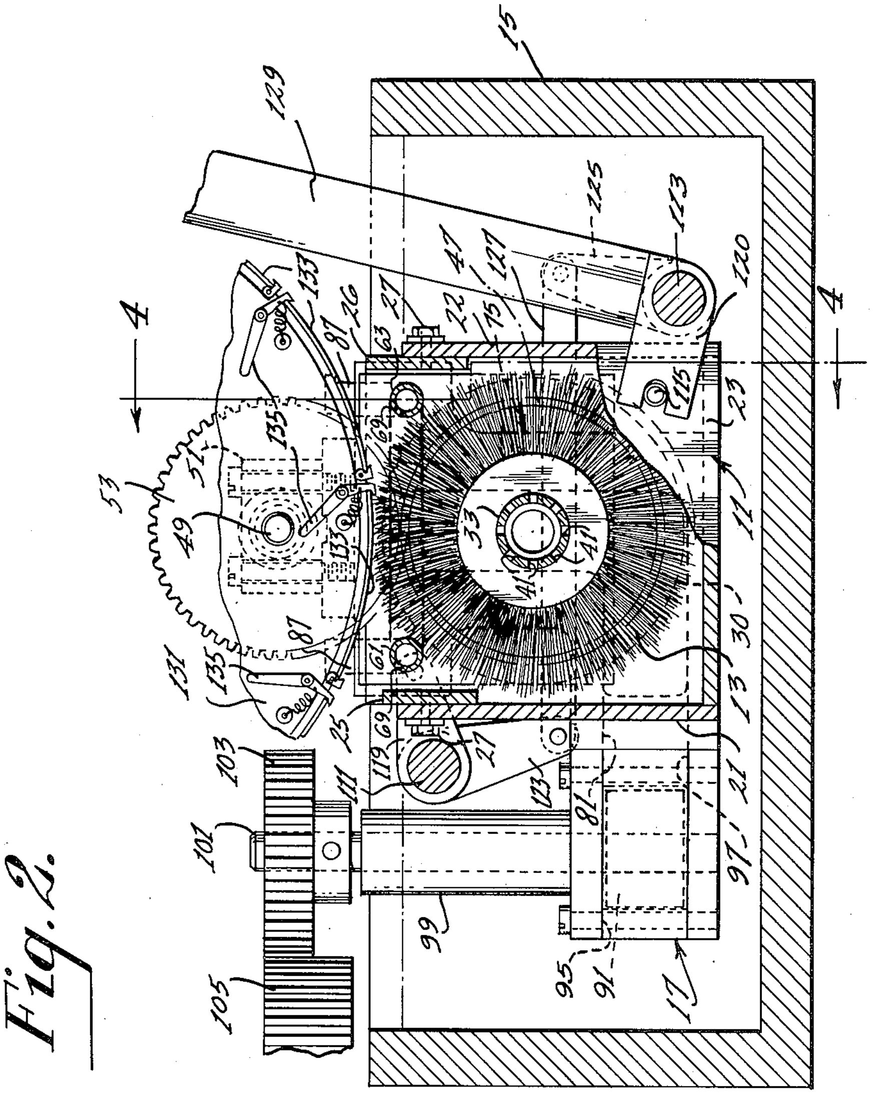
Figure 2 is a sectional view, in front elevation, taken along the line 2—2 of Figure 1 looking in the direction of the appended arrows and illustrating a portion of the conveyor mechanism for the printed circuits.
Figure 3:
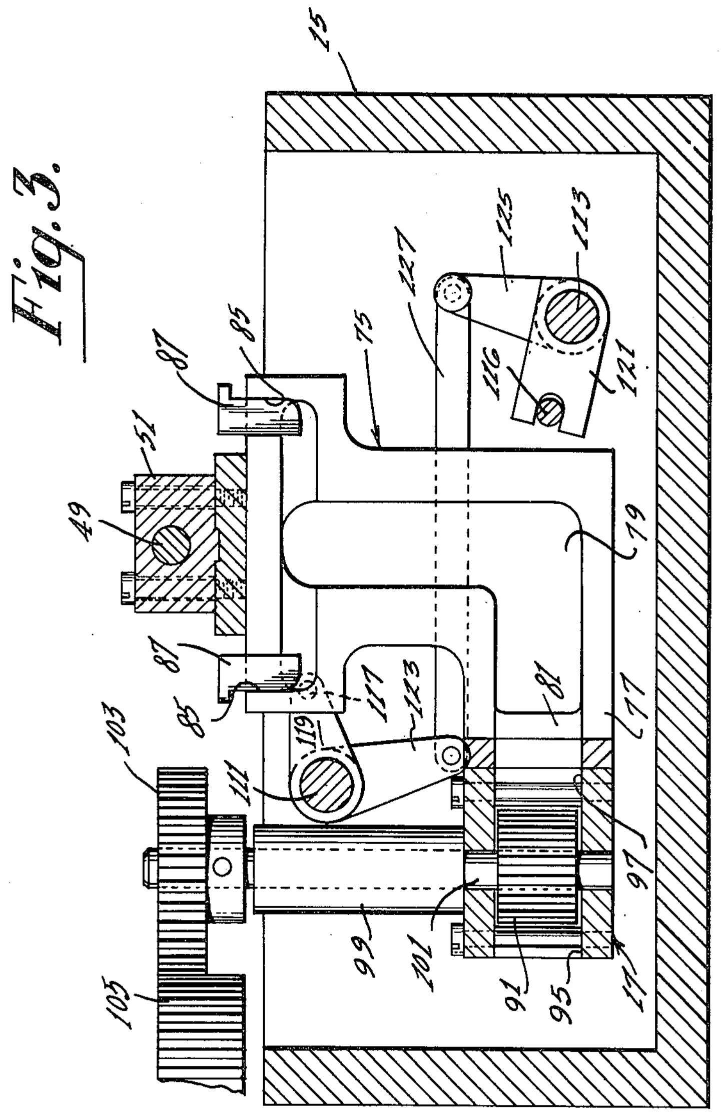
Figure 3 is a sectional view, in front elevation, taken along the line 3—3 of Figure 1 looking in the direction of the appended arrows and illustrating a solder pump and manifold.
Figure 4:
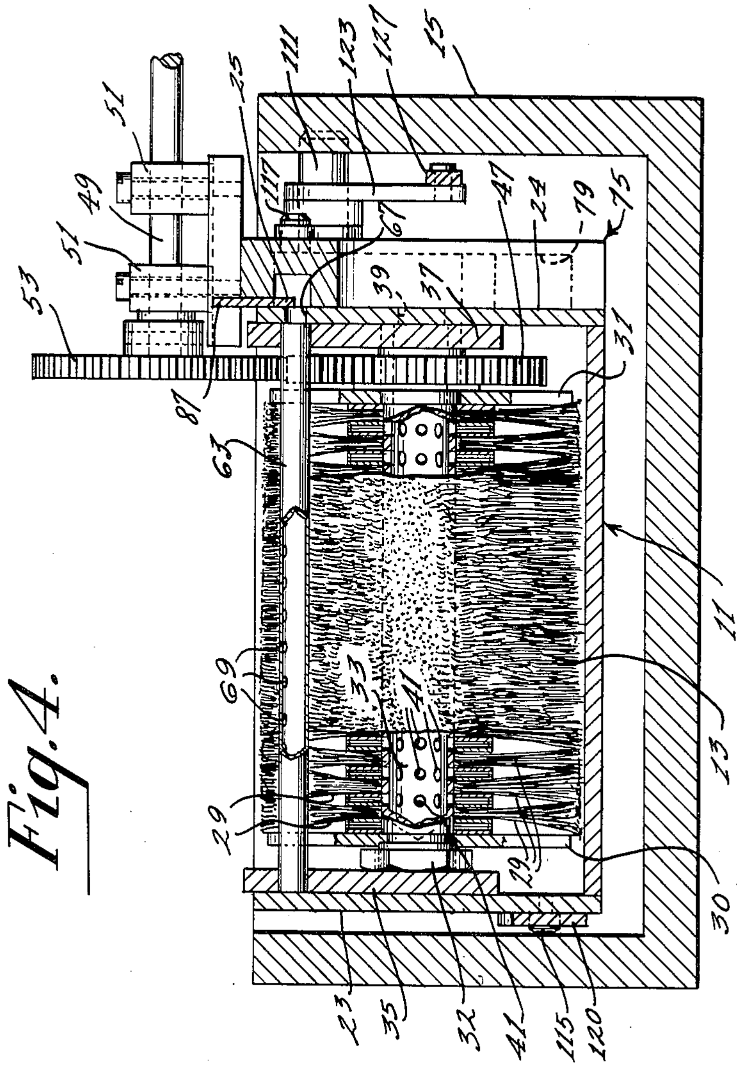
Figure 4 is a sectional view, in side elevation, taken along the line 4—4 of Figure 2 looking in the direction of the appended arrows, in which the conveyor mechanism is not shown.

Referring now particularly to Figure 2, it will be seen that, when the operating arm 129 is in the position illustrated, the tank 11 is in a raised position with respect to the reservoir 15. When the operating arm is moved to the left, from its position shown in Figure 2, the tank 11 will be lowered with respect to the reservoir 15. This raising and lowering mechanism is provided so that the tank 11 and the rotary brush 13 may be completely submerged beneath the solder level in the reservoir 15 when the machine is not in operation. This is desirable to prevent the surface of the brush 13 from becoming clogged with the scum or surface contamination which forms on the surface of the molten solder. An additional advantage of this arrangement is that the solder pump may be turned off during periods of temporary idleness of the machine without the danger of permitting the rotary brush to become clogged.

The operation of the machine will now be described. It is assumed that, before operation, the tank 11 is completely submerged in the reservoir 15. Before raising the tank 11 to expose the rotary brush 13, the drive means for the rotary brush will be turned on and the solder pump will also be turned on. In this manner, when the tank is raised, no particular portion of the periphery of the brush is exposed above the solder level for any length of time and the portion that is exposed is protected by the flow of a film of solder over the brush as above described.

The raising of the tank 11 and the rotary brush 13 may also raise the rotary brush into operating position with respect to a rotary conveyor 131. The rotary conveyor 131 is shown, illustratively, as a means for bringing the printed circuit boards 133 into engagement with the rotary brush 13. The conveyor includes spring loaded clamping arms 135 which engage opposite ends of the printed circuit board and hold them against the periphery of the conveyor.

The rotation of the rotary brush 113 is provided, as above mentioned, to prevent any one portion of the periphery of the brush from being exposed above the surface of the solder for any substantial length of time. Rotation of the brush further provides a relative movement between the surface of the circuit boards carried on the conveyor and the surface of the rotary brush. This is desirable to provide a certain amount of wiping of the surface being soldered to control the application of solder to the surface.

When the periphery of the brush 13 is being engaged by a printed circuit board, the problem of exposure of the brush to the air is of secondary importance. However the space between adjacent printed circuit boards on the conveyor may be sufficient to permit the formation of oxide on the brush surface. Also dross and scum may form on the surface in the area immediately adjacent the rotary brush during soldering. In order to provide a protective solder film for the brush and to carry any surface contamination away from the immediate area of the brush, the solder is caused to flow across the surface of the tank 11 and over the exposed surface of the brush. This may be accomplished in two ways. By means of the tubes 61 and 63 the solder may be induced to flow from one side of the tank 11 across the rotary brush 13 and toward the other side of the tank where it is spilled over the side into the reservoir 15. Referring particularly to Figure 2, the tubes 61 and 63 may be rotated so that the flow of solder from the apertures 69 will direct the flow of solder from right to left. The gate 24 will be positioned lower than the gate 23 to permit the flow of solder to spill over the side wall 21 and into the reservoir 15. The flow of solder might also be provided by merely adjusting the gates one high and one low to provide a surface gradient in the tank 11 which would provide for the flow of solder across the rotary brush 13. Such flow might be aided by blocking off the tube 61 by means of its gate 87 and merely pumping solder to the high side of the tank through the tube 63.

In order to provide the desired type of solder joint in printed circuit boards, it is necessary to keep the solder as clean as possible. The above described machine of this invention accomplishes this result. This has been accomplished by: (1) completely submerging the rotary brush in solder when the brush is not in use, (2) flowing a protective film of solder over the exposed portion of the brush between soldering operations, and (3) forcing solder from the center of the brush outwardly to its periphery to clean the brush of contamination which might become lodged therein.

In using a machine in accordance with the present invention for soldering printed circuits in the manner above described, three distinct and significant advantages in addition to those stated above are provided over soldering accomplished by the dip-soldering technique. These advantages are a shortened soldering time, a lower temperature solder bath, and control of the amount of solder deposited on the article being soldered.

In using the dip-soldering technique, a substantial amount of time is required to assure a good bond between the solder and the metallic surface to be soldered. Time is required because there is no forceful bonding of the solder with the metallic surface. In addition, during the soldering, gases are formed between the solder and the metallic surface which tend to prevent a bonding of the solder to the surface. Time must be provided for these gases to be driven off. In applying the solder by means of a rotating brush, the solder is forced against the metallic surface and is effectively painted onto the surface. This forcing of the solder against the surface causes the solder to bond itself more rapidly to the surface and also tends to prevent the formation of gas bubbles or pockets adjacent the metallic surface thereby eliminating the time necessary to dissipate these gases. Because of this, a very substantial reduction in soldering time is provided.

The temperature at which the solder bath must be maintained may also be reduced when applying solder in the manner above described. This again is due to the forceful application of the solder to the metallic surface which eliminates the necessity of having the solder bath at a higher temperature in order to provide good bonding between the solder and the metallic surface.

A very substantial advantage in using the above described machine is that the amount of solder which is bonded to the metallic surface can be accurately controlled. This advantage is significant from the standpoint of economy, in that the amount of solder applied may be reduced, and also from the standpoint of weight which may be an important factor in producing printed circuits for use in air-borne equipment. The amount of solder deposited on the metallic surface is controlled directly by the pressure applied between the rotating brush and the article being soldered and, of course, indirectly by the position of the brush with respect to the article. If the brush is positioned closer to the article a greater wiping action occurs and less solder is applied to the metallic surface. Correspondingly, if the brush is positioned farther from the article, a greater amount of solder will be applied to the metallic surface.

What is claimed is:

1. In a machine for applying solder to a surface of a sheet material, a container for molten solder, a hollow perforated spindle, means rotatably supporting said spindle in said container, means for rotating said spindle, a rotary brush carried on said spindle, means for controlling the solder level in said container whereby only a small portion of the peripheral surface of said rotary brush is exposed, means for engaging the exposed portion of said brush with a surface of said sheet, a solder reservoir, means for forcing solder from said reservoir into said hollow spindle whereby solder is forced outwardly through the said brush, means for directing the surface flow of solder in said container across the exposed surface of said brush whereby surface contamination of said solder is carried away from said brush, and means for directing the surface flow of solder in said container out of said container to said reservoir.

2. In a machine for applying solder to a surface of a sheet material, a tank for molten solder, a hollow spindle having axially and radially spaced apertures, means rotatably supporting said spindle in said tank, means for driving said spindle, a rotary brush carried on said spindle, means for controlling the solder level in said tank whereby only a small portion of the peripheral surface of said rotary brush is exposed above the surface of the solder, means for engaging the exposed portion of said brush with a surface of said sheet, a solder reservoir, a solder pump disposed in said reservoir for forcing solder from said reservoir into said hollow spindle whereby solder is forced from said spindle outwardly through the said brush, solder dispensing means disposed in said tank adjacent the solder level thereof, said last named means being connected to said solder pump, and means for controlling the flow of solder from said solder dispensing means whereby a surface flow of solder in said container is maintained across the exposed surface of said brush.

3. In a machine for applying solder to the surface of a sheet, a solder reservoir, a tank for containing solder disposed in said reservoir, a rotary wire brush in said tank disposed to be submerged in solder in said tank and having a portion thereof protruding for producing brushing engagement with the surface of a sheet passed thereover, a hollow spindle for rotatably supporting said brush, the walls of said spindle being provided with axially and radially spaced apertures, means including a solder pump for forcing solder from said reservoir into said hollow spindle, means connected to said solder pump for directing a flow of solder over the exposed portion of said rotary brush, means for driving said rotary brush, and means for passing said sheet in engagement with the protruding portion of said rotary brush whereby a coating of solder is applied to conductive portions of said sheet.

4. In a machine for applying solder to the surface of a sheet, a solder reservoir, a solder containing tank disposed in said reservoir, a hollow spindle rotatably mounted in said tank, the walls of said hollow spindle being provided with axially and radially spaced apertures, means for driving said spindle, a rotary wire brush carried on said spindle, means for controlling the solder level in said tank whereby only a small portion of the peripheral surface of said rotary brush extends out of the solder, means including a solder pump for forcing solder from said reservoir into said hollow spindle, means associated with said tank and connected with said pump for directing a flow of solder over the portion of said rotary brush exposed above said solder, means for passing said sheet in engagement with the exposed surface of said rotary brush whereby a coating of solder is applied to conductive portions of said sheet, and means for positioning said tank in an upper and a lower position in said reservoir, said tank in said upper position extending above the solder level in said reservoir, said tank in said lower position being disposed beneath the solder level in said reservoir whereby said rotary brush is completely submerged in solder in said reservoir.

5. In a machine for applying solder to the surface of a sheet, a tank for molten solder, a hollow apertured spindle, means rotatably supporting said spindle in said tank, a rotary wire brush carried on said spindle, said brush being substantially submerged in a solder bath in said tank, means for engaging a surface of said sheet with the exposed portion of said brush, said tank being disposed in an outer solder reservoir, a solder pump mounted on said tank for forcing solder from said reservoir into said spindle whereby solder is forced toward the outer surface of said brush, a pair of apertured tubes mounted adjacent the top of said tank, means connecting said tubes to said solder pump, said tubes being provided for directing the surface flow of solder in said tank transversely across the exposed surface of said rotary brush, and means for directing the surface flow of solder in said container over one side of said tank whereby surface contamination on said solder is carried away from said rotary brush.

6. In a machine for applying solder to the surface of a sheet, an inner tank and an outer tank for containing molten solder, said inner tank being contained in said outer tank, a hollow apertured spindle rotatably mounted in said inner tank, a rotary wire brush carried on said spindle, means for rotating said spinlle, said rotary brush being substantially submerged in solder in said inner tank, means for engaging a surface of said sheet with the exposed portion of said brush, a solder pump mounted on said inner tank for pumping solder from said outer tank into said spindle whereby solder is forced through said brush toward its peripheral surface, means associated with said inner tank and connected to said solder pump for directing the surface flow of solder in said inner tank transversely across the exposed surface of said rotary brush, means for directing the surface flow of solder in said inner tank over one side thereof whereby surface contamination on said solder is carried away from said rotary brush, and means for lowering said inner tank into said outer tank to completely submerge said inner tank and said rotary brush in molten solder.

References Cited in the file of this patent

UNITED STATES PATENTS

| | | |
|---|---|---|
| 2,342,130 | Emmer | Feb. 22, 1944 |
| 2,547,091 | Peffer | Apr. 3, 1951 |
| 2,579,634 | Warren | Dec. 25, 1951 |